US012696455B2

(12) United States Patent
Park et al.

(10) Patent No.: US 12,696,455 B2
(45) Date of Patent: Jul. 28, 2026

(54) NON-VOLATILE MEMORY DEVICE AND OPERATING METHOD OF THE SAME

(71) Applicants: UNIST (ULSAN NATIONAL INSTITUTE OF SCIENCE AND TECHNOLOGY), Ulsan (KR); POSTECH RESEARCH AND BUSINESS DEVELOPMENT FOUNDATION, Pohang-si (KR)

(72) Inventors: Kibog Park, Ulsan (KR); Seokhyeong Kang, Pohang-si (KR); Sungchul Jung, Cheongju-si (KR); Jinyoung Park, Ulsan (KR); Jaehyeong Jo, Ulsan (KR); Junhyung Kim, Gimhae-si (KR); Wonho Song, Ulsan (KR)

(73) Assignees: UNIST (Ulsan National Institute of Science and Technology), Ulsan (KR); Postech Research and Business Development Foundation, Gyeongsangbuk-do (KR)

( * ) Notice: Subject to any disclaimer, the term of this patent is extended or adjusted under 35 U.S.C. 154(b) by 599 days.

(21) Appl. No.: 17/969,123

(22) Filed: Oct. 19, 2022

(65) Prior Publication Data

US 2023/0127162 A1 Apr. 27, 2023

(30) Foreign Application Priority Data

Oct. 26, 2021 (KR) ........................ 10-2021-0143329
Aug. 17, 2022 (KR) ........................ 10-2022-0102892

(51) Int. Cl.
H10B 51/20 (2023.01)
(52) U.S. Cl.
CPC ................................... H10B 51/20 (2023.02)

(58) Field of Classification Search
CPC .............. G11C 11/223; G11C 11/2255; G11C 11/2257; H10B 51/20; H10B 51/30;
(Continued)

(56) References Cited

U.S. PATENT DOCUMENTS 11,908,901 B1 * 2/2024 Koester ................... H10D 1/64
2014/0145735 A1 * 5/2014 Koester ............... G01N 27/227
324/686
(Continued)

FOREIGN PATENT DOCUMENTS

KR 10-2009-0039610 A 4/2009
KR 101385735 B1 4/2014

OTHER PUBLICATIONS

Wang, P. and S. Yu. "Ferroelectric devices and circuits for neuro-inspired computing." *MRS Communications* (2010), 10: pp. 538-548.

(Continued)

*Primary Examiner* — Meiya Li
(74) *Attorney, Agent, or Firm* — Harness, Dickey & Pierce, P.L.C.

(57) ABSTRACT

Provided are a non-volatile memory device and a method of operating the same. The non-volatile memory device includes a substrate, a plurality of word lines extending in a first direction on the substrate, a plurality of ferroelectric patterns respectively provided on the word lines, a blocking insulating film covering the ferroelectric patterns, a plurality of bit line pairs including a first bit line and a second bit line extending in a second direction crossing the word lines and the ferroelectric patterns on the blocking insulating film and intersecting the first direction, and a channel pattern provided between the first bit line and the second bit line of each (Continued)

of the bit line pairs on the blocking insulating film, wherein the channel pattern has an ambipolar conduction characteristic.

20 Claims, 17 Drawing Sheets

(58) Field of Classification Search
CPC ............. H10D 30/6741; H10D 62/882; H10D 64/033; H10D 64/689
See application file for complete search history.

(56) References Cited

U.S. PATENT DOCUMENTS

| | | |
|---|---|---|
| 2014/0233297 A1 | 8/2014 | Ozyilmaz et al. |
| 2020/0144293 A1 | 5/2020 | Majhi et al. |
| 2022/0328346 A1* | 10/2022 | Lai ..................... H10B 12/0335 |
| 2024/0206187 A1* | 6/2024 | Kim ..................... H10D 30/701 |

OTHER PUBLICATIONS

Yang, X et al. "Graphene Ambipolar Multiplier Phase Detector." *IEEE Electron Device Letters*, vol. 32, No. 10 (2011): pp. 1328-1330.

Sejoon Lee et al., Graphene/lead-zirconate-titanate ferroelectric memory devices with tenacious retention characteristics, Carbon, 2017.

Sungchul Jung et al., Giant Electroresistance in Edge Metal-Insulator-Metal Tunnel Junctions Induced by Ferroelectric Fringe Fields, Scientific Reports, 2016.

Su-Ting Han et al., Towards the Development of Flexible Non-Volatile Memories, Adv. Mater. 2013.

Ronald C. G. Naber et al., Organic Nonvolatile Memory Devices Based on Ferroelectricity, Adv. Mater. 2009.

Sungchul Jung et al., Self-selective ferroelectric memory realized with semimetalic graphene channel, npj 2D Materials and Applications, 2021.

Sungchul Jung, et al., Supplementary Information for "Self-Selective Ferroelectric Memory Realized with Semimetalic Graphene Channel", 2021.

* cited by examiner

117

D1

D2

D3

117
115
113
111
101
100

A                                    A'

D3

D2

VA
CHP
PD
WL
122

BL1
BL2 } BP

A    A'

D1
D2
D3

NON-VOLATILE MEMORY DEVICE AND OPERATING METHOD OF THE SAME

CROSS-REFERENCE TO RELATED APPLICATIONS

This U.S. non-provisional patent application claims priority under 35 U.S.C. § 119 of Korean Patent Application Nos. 10-2021-0143329, filed on Oct. 26, 2021, and 10-2022-0102892, filed on Aug. 17, 2022, the entire contents of which are hereby incorporated by reference.

BACKGROUND

The present disclosure relates to a non-volatile memory device and an operating method thereof, and more particularly, to a non-volatile memory device based on transconductance switching of an ambipolar channel and an operating method thereof.

The inventive concept relates to a non-volatile memory device and an operating method thereof, and more particularly, to a non-volatile memory device based on transconductance switching of an ambipolar channel and an operating method thereof.

SUMMARY

The present disclosure provides a non-volatile memory device based on transconductance switching of an ambipolar channel and an operating method thereof.

An embodiment of the inventive concept provides a non-volatile memory device including: a substrate; a plurality of word lines extending in a first direction on the substrate; a plurality of ferroelectric patterns respectively provided on the word lines; a blocking insulating film covering the ferroelectric patterns; a plurality of bit line pairs including a first bit line and a second bit line extending in a second direction crossing the word lines and the ferroelectric patterns on the blocking insulating film and intersecting the first direction; and a channel pattern provided between the first bit line and the second bit line of each of the bit line pairs on the blocking insulating film, wherein the channel pattern has an ambipolar conduction characteristic.

In an embodiment, the channel pattern may include Dirac semimetal.

In an embodiment, the channel pattern may include graphene.

In an embodiment, each of the ferroelectric patterns may correspond to each of the word lines and extends in the first direction.

In an embodiment, a width of each of the ferroelectric patterns in the second direction may be equal to a width of each of the word lines in the second direction.

In an embodiment, the ferroelectric patterns may include at least one of lead zirconate titanate (PZT), barium titanate (BaTiO$_3$), polyvinylidene fluoride (PVDF), ZnO, HfO$_x$, HfO$_x$, Hf$_{0.5}$Zr$_{0.5}$O$_2$ (HZO), (HfO$_2$)$_x$(Al$_2$O$_3$)$_{1-x}$(HAO), and Al$_x$Sc$_{1-x}$N.

In an embodiment, the blocking insulating film may include aluminum oxide (Al$_2$O$_3$) or silicon oxide (SiO$_2$).

In an embodiment, each of the first bit line and the second bit line may be provided in plurality on the blocking insulating film and is provided alternately while going in the first direction.

In an embodiment, in any one of the bit line pairs, an interval between the first bit line and the second bit line may be smaller than an interval between two adjacent ones of the bit line pairs.

In an embodiment, the channel pattern may extend between the first bit line and the blocking insulating film and between the second bit line and the blocking insulating film.

In an embodiment, the channel pattern may be provided in plurality between one of the bit line pairs.

In an embodiment, the channel pattern may be provided in plurality, wherein the channel patterns may be arranged in an array form on the blocking insulating film.

In an embodiment of the inventive concept, provided is an operating method of a non-volatile memory device, wherein the non-volatile memory device includes a substrate; a plurality of word lines extending in a first direction on the substrate; a plurality of ferroelectric patterns respectively provided on the word lines; a blocking insulating film covering the ferroelectric patterns; a plurality of bit line pairs including a first bit line and a second bit line extending in a second direction crossing the word lines and the ferroelectric patterns on the blocking insulating film and intersecting the first direction; and a channel pattern provided between the first bit line and the second bit line of each of the bit line pairs on the blocking insulating film, wherein the method includes: applying a bias voltage between the bit line pairs so that a current flows in the channel pattern; and measuring a degree of change in a channel current while changing a voltage applied to the word line.

In an embodiment, when there is no electron trap state on an upper portion of the blocking insulating film, increasing a voltage applied to the word line when a memory state is "1" may increase the channel current, and when a memory state is "0", increasing the voltage applied to the word line may decrease the channel current.

In an embodiment, when there is an electron trap state on an upper portion of the blocking insulating film, increasing a voltage applied to the word line when a memory state is "1" may decrease the channel current, and when a memory state is "0", increasing the voltage applied to the word line may increase the channel current.

In an embodiment, the method may further include extracting a transconductance value from the channel current.

In an embodiment, in measuring the degree of change of the channel current, a voltage applied to the word line may change around 0 V.

In an embodiment, the channel pattern may include Dirac semimetal.

In an embodiment, the channel pattern may be provided in plurality between the bit line pairs.

In an embodiment, the channel pattern may be provided in plurality, wherein the channel patterns may be arranged in an array form on the blocking insulating film.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 11A to 16A are plan views illustrating a method of manufacturing a non-volatile memory device according to embodiments of the inventive concept;

FIGS. 11B to 16B are cross-sectional views taken along line A-A' of FIGS. 11A to 16A.

DETAILED DESCRIPTION

Figure 1:
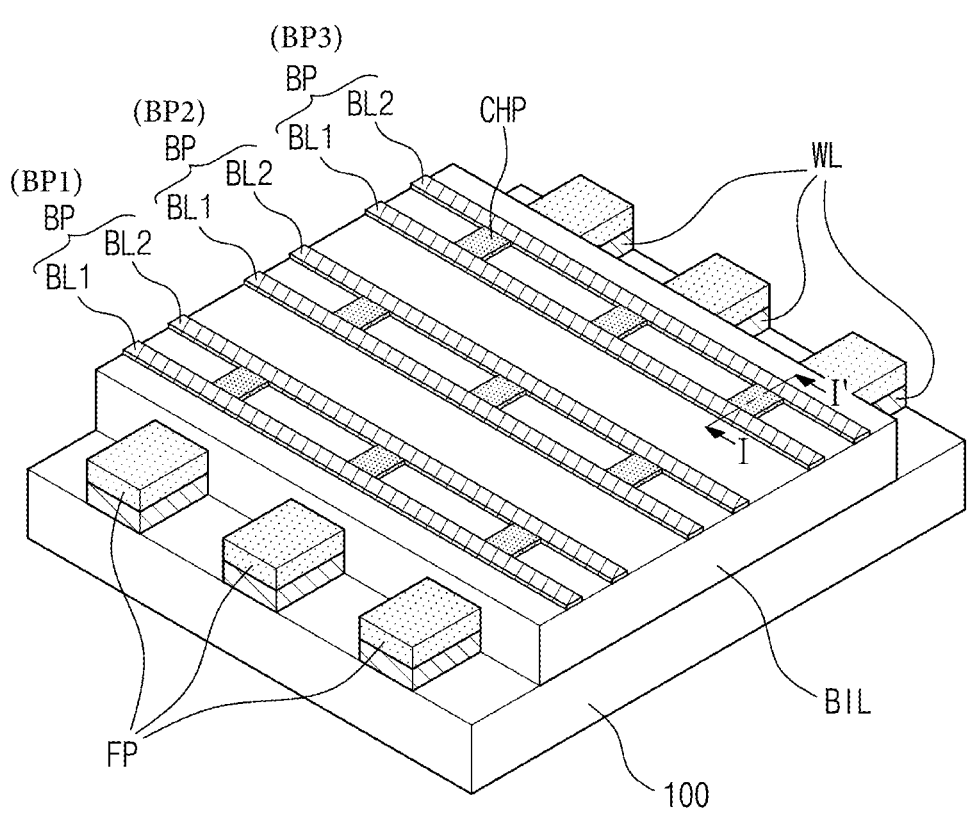
FIG. 1 is a perspective view illustrating a non-volatile memory device according to embodiments of the inventive concept.
Figure 1:
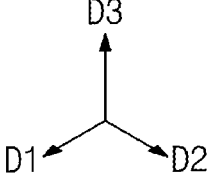

In order to fully understand the configuration and effects of the inventive concept, preferred embodiments of the inventive concept will be described in detail with reference to the accompanying drawings.

The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, for convenience of description, the ratio of each component may be exaggerated or reduced.

The terms used in this specification are for describing embodiments and are not intended to limit the inventive concept. In addition, terms used in the present specification may be interpreted as meanings commonly known to those of ordinary skill in the art, unless otherwise defined.

In this specification, the singular form also includes the plural form unless specifically stated in the phrase. As used in the specification, in relation to 'comprises' and/or 'comprising', the mentioned elements, steps, operations and/or elements do not exclude the presence or addition of one or more other elements, steps, operations and/or elements.

In this specification, terms such as first and second are used to describe various areas, directions, shapes, etc., but these areas, directions, and shapes should not be limited by these terms. These terms are only used to distinguish one area, direction, or shape from another area, direction, or shape. Accordingly, a portion referred to as a first portion in one embodiment may be referred to as a second portion in another embodiment. The embodiments described and illustrated herein also include complementary embodiments thereof. Like reference numerals refer to like elements throughout the specification.

Hereinafter, a non-volatile memory device and an operating method thereof according to embodiments of the inventive concept will be described in detail with reference to the drawings.

Figure 2:
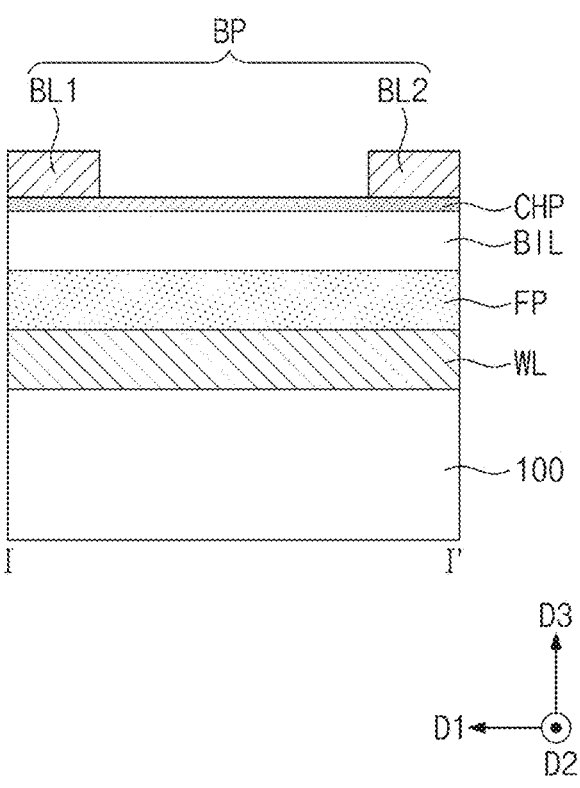
FIG. 2 is a cross-sectional view illustrating a non-volatile memory device according to embodiments of the inventive concept, and corresponds to a cross-sectional view taken along line I-I' in FIG. 1.

FIG. 1 is a perspective view illustrating a non-volatile memory device according to embodiments of the inventive concept. FIG. 2 is a cross-sectional view illustrating a non-volatile memory device according to embodiments of the inventive concept, and corresponds to a cross-sectional view taken along line I-I' in FIG. 1.

Referring to FIGS. 1 and 2, a non-volatile memory device according to the inventive concept may include a substrate 100, word lines WL, ferroelectric patterns FP, a blocking insulating film BIL, bit line pairs BP, and channel patterns CHP.

The substrate 100 may be, for example, a semiconductor substrate including at least one of silicon, germanium, and silicon-germanium, a silicon on insulator (SOI) substrate, a compound semiconductor substrate, a glass substrate, or a plastic substrate. An insulating layer of oxide ($SiO_2$, $Al_2O_3$, $HfO_2$, etc.) or nitride (AlN, BN, etc.) is provided on the surface of the semiconductor substrate to block leakage current through the substrate. The substrate 100 may extend in a first direction D1 and a second direction D2 crossing the first direction D1. An upper surface of the substrate 100 may be orthogonal to a third direction D3 intersecting the first direction D1 and the second direction D2. For example, the first direction D1, the second direction D2, and the third direction D3 may be directions orthogonal to each other.

A plurality of word lines WL extending in the first direction D1 may be provided on the substrate 100. The word lines WL may be referred to as gate lines. The word lines WL may directly contact the upper surface of the substrate 100. The word lines WL may include at least one selected from among doped semiconductors (e.g., doped silicon, etc.), metals (e.g., tungsten, copper, aluminum, platinum, titanium, tantalum, etc.), and conductive metal nitrides (e.g., titanium nitride, tantalum nitride, etc.).

A plurality of ferroelectric patterns FP may be provided on the word lines WL, respectively. In other words, the ferroelectric patterns FP may correspond to the word lines WL, respectively. Each of the ferroelectric patterns FP may extend in the first direction D1. A width of each of the ferroelectric patterns FP in the second direction D2 may be substantially the same as a width of each of the word lines WL in the second direction D2. The ferroelectric patterns FP may include a ferroelectric material having spontaneous polarization (SP) without an external electric field. The ferroelectric patterns FP may include, for example, any one of lead zirconate titanate (PZT), barium titanate ($BaTiO_3$), polyvinylidene fluoride (PVDF), ZnO, $HfO_x$, $Hf_{0.5}Zr_{0.5}O_2$ (HZO), $(HfO_2)_x(Al_2O_3)_{1-x}$(HAO), and $Al_xS_{1-x}N$.

A blocking insulating film BIL covering the word lines WL and the ferroelectric patterns FP may be provided on the substrate 100. The blocking insulating film BIL may cover an upper surface of the substrate 100, sidewalls of the word lines WL, and sidewalls and upper surfaces of the ferroelectric patterns FP. An upper surface of the blocking insulating film BIL may be substantially flat. The blocking insulating film BIL may include, for example, aluminum oxide ($Al_2O_3$) or silicon oxide ($SiO_2$).

A plurality of bit line pairs BP including bit line pairs BP1, BP2, and BP3 crossing the word lines WL and the ferroelectric patterns FP and extending in the second direction D2 may be provided on the blocking insulating film BIL. Each of the bit line pairs BP may include one first bit line BL1 and one second bit line BL2. The first bit line BL1 may be referred to as a source line, and the second bit line BL2 may be referred to as a drain line. Each of the first bit line BL1 and the second bit line BL2 may be provided in plurality on the blocking insulating film BIL, and may be provided alternately while going in the first direction D1. In any one of the bit line pairs BP, an interval between the first bit line BL1 and the second bit line BL2 may be smaller than an interval between two adjacent ones of the bit line pairs BP. An interval in the first direction D1 between the first bit line BL1 and the second bit line BL2 in bit line pair BP2 may be smaller than an interval in the first direction D1 between the first bit line BL1 of the second bit line pair BP2 and the second bit line BL2 of the first bit line pair BP2, and may also be smaller than the an interval in the first direction D1 between the second bit line BL2 of the second bit line pair BP2 and the first bit line BL1 of the third bit line pair BP3. The first bit line BL1 and the second bit line BL2 may include, for example, at least one selected from among doped semiconductors (e.g., doped silicon, etc.), metals (e.g., tungsten, copper, aluminum, platinum, titanium, tantalum, etc.) and conductive metal nitrides (e.g., titanium nitride, tantalum nitride, etc.).

A plurality of channel patterns CHP may be provided between the first bit line BL1 and the second bit line BL2 of each of the bit line pairs BP on the blocking insulating film BIL. Each of the channel patterns CHP may overlap each of the word lines WL in the third direction D3. An upper surface of each of the channel patterns CHP may be exposed between the first bit line BL1 and the second bit line BL2. According to embodiments, each of the channel patterns CHP may extend between the first bit line BL1 and the blocking insulating film BIL and between the second bit line BL2 and the blocking insulating film BIL, but the inventive concept is not limited thereto. The channel patterns CHP may have ambipolar conduction characteristics. The channel patterns CHP may include Dirac semimetal. The channel patterns CHP may include, for example, graphene.

One of the word lines WL, one of the bit line pairs BP, and one of the channel patterns CHP which is overlapped with one of the word lines WL in the third direction D3 and provided between one of the bit line pairs BP may constitute one ferroelectric field effect transistor (FeFET). The FeFET may be a single memory cell that stores a memory state. A plurality of FeFETs may be provided on the substrate 100. A plurality of FeFETs may be arranged in an array form on the substrate 100.

According to the inventive concept, the channel patterns CHP provided between one bit line pair BP may be connected in parallel between a common source line and a common drain line, and the same drain voltage may be applied to all the channel patterns CHP. Accordingly, a change in electrical conductivity according to the gate voltage applied to the word line WL may be independently measured. Also, due to the fact that the memory cells are arranged in an array, the number of memory cells connected to one bit line may be increased while maintaining operation characteristics (transconductance, etc.) of each of the memory cells.

According to the inventive concept, it is possible to implement a non-volatile memory device capable of random access without a selection element or an additional write electrode. Since a separate selection element or an additional write electrode is not required, the structure of the memory cell is simplified and it is very advantageous to increase the density of the memory cell.

Figure 3:
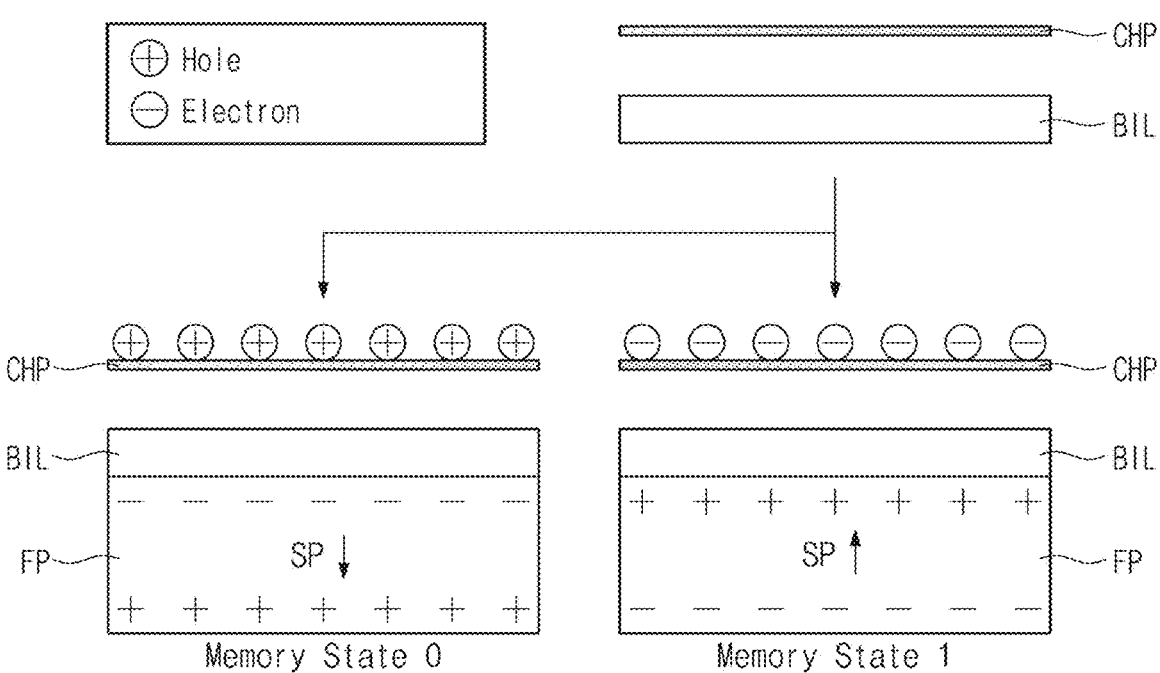
FIGS. 3 and 6 are conceptual diagrams for explaining a method of operating a non-volatile memory device according to embodiments of the inventive concept.
Figure 5:
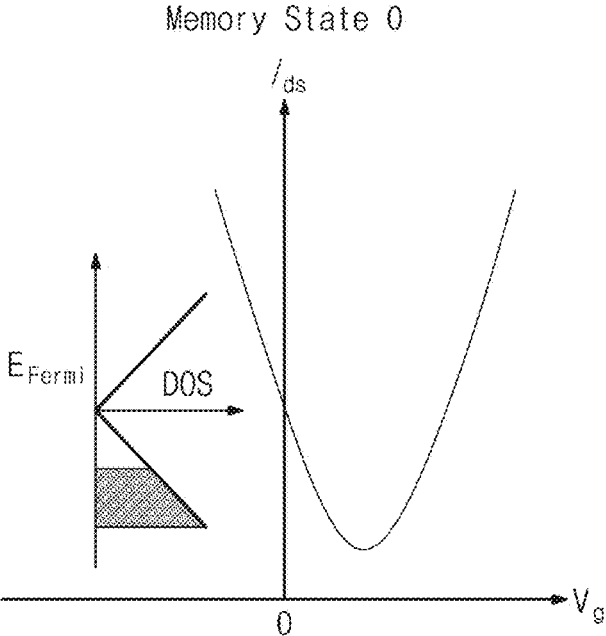
Figure 6:
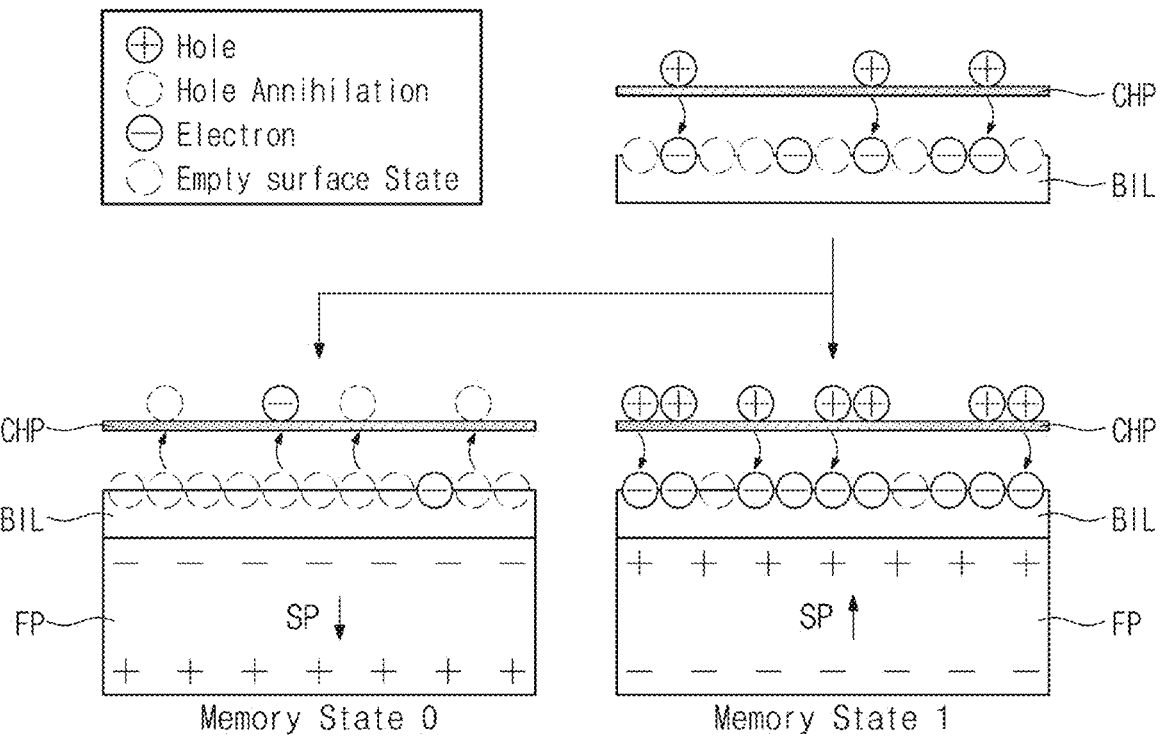

FIGS. 3 and 6 are conceptual diagrams for explaining a method of operating a non-volatile memory device according to embodiments of the inventive concept. FIGS. 4, 5, 7, and 8 are graphs for explaining a method of operating a non-volatile memory device according to embodiments of the inventive concept.

Figure 4:
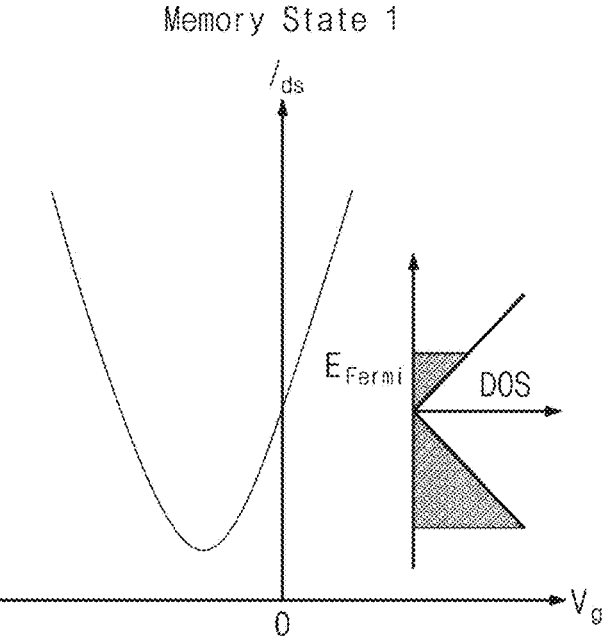
FIGS. 4, 5, 7, 8, 9, and 10 are graphs for explaining a method of operating a non-volatile memory device according to embodiments of the inventive concept.
Figure 7:
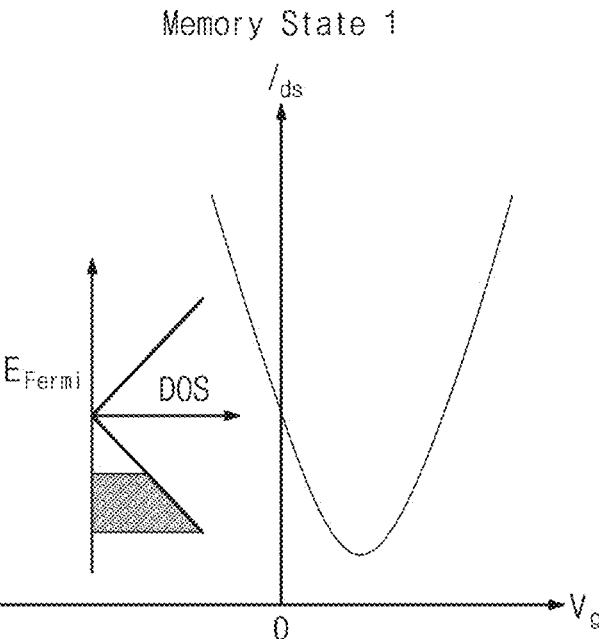
Figure 8:
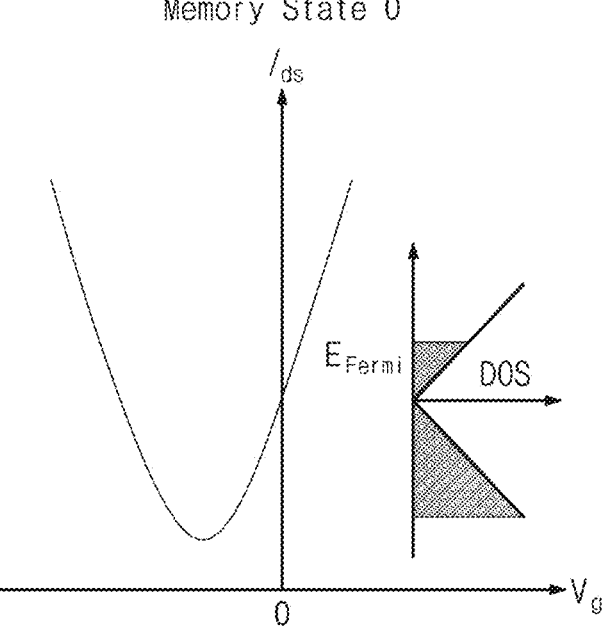

More specifically, FIGS. 3, 4 and 5 are diagrams for explaining an operating method of a non-volatile memory device when there is no electron trap state on top of the blocking insulating film BIL (that is, normal hysteretic behavior), and FIGS. 6, 7, and 8 are diagrams for explaining a method of operating a non-volatile memory device when there is an electron trap state on top of the blocking insulating film BIL (that is, anti-hysteretic behavior).

Hereinafter, the memory state "1" means a case in which the SP direction of the ferroelectric pattern FP is directed upward (i.e., the third direction D3), and the memory state "0" means a case in which the SP direction of the ferroelectric pattern FP is downward (i.e., the direction opposite to the third direction D3).

A write-in method of a non-volatile memory device will be described based on any one memory cell with reference to FIG. 2. Changing the memory state of the memory cell to "1" may be performed by applying a positive voltage V1 to the word line WL and a negative voltage $-V_2$ to the bit line pair BP. In addition, changing the memory state of the memory cell to "0" may be performed by applying a negative voltage $-V_1$ to the word line WL and a positive voltage $V_2$ to the bit line pair BP. The $V_1$ and $V_2$ may satisfy the condition of the following [Equation 1]. In this case, $V_C$ is a coercive voltage.

$$V_1 + V_2 \geq V_C, \, V_1 < V_C, \, C_2 < V_C \qquad \text{[Equation 1]}$$

After changing the memory state, even if the voltage applied to the word line WL and the bit line pair BP is erased, the SP direction of the ferroelectric pattern FP may be maintained.

Referring to FIGS. 3, 4, and 5, while the memory state is "1" when there is no electron trap state on the upper portion of the blocking insulating film BIL, positive charges are induced on the upper surface of the ferroelectric pattern FP. Accordingly, the channel pattern CHP is doped with a first conductivity type (e.g., n-type), and a charge neutrality point (CNP) of the channel pattern CHP becomes smaller than 0 V. On the other hand, when the memory state is "0", negative charges are induced on the upper surface of the ferroelectric pattern FP. Accordingly, the channel pattern CHP is doped with a second conductivity type (e.g., p-type) different from the first conductivity type, and the CNP of the channel pattern CHP becomes greater than 0 V.

Referring to FIGS. 6, 7, and 8, while the memory state is "1" when there are electron trap states on the top of the blocking insulating film BIL, electron transfer occurs from the channel pattern CHP to the trap state of the blocking insulating film BIL by the positive charge induced on the upper surface of the ferroelectric pattern FP. Accordingly, the channel pattern CHP is doped to the second conductivity type, and the CNP of the channel pattern CHP becomes greater than 0 V. On the other hand, when the memory state is "0", electron transfer occurs from the trap state of the blocking insulating film BIL to the channel pattern CHP by negative charges induced on the upper surface of the ferroelectric pattern FP. Accordingly, the channel pattern CHP is doped to the first conductivity type, and the CNP of the channel pattern CHP is less than 0 V.

A read-out method of a non-volatile memory device will be described based on any one memory cell with reference to FIG. 2 again. Reading the memory state of a memory cell may be performed by applying a predetermined bias voltage between the bit line pairs BP so that a current flows in the channel pattern CHP; and measuring the degree of change in the channel current while changing the voltage applied to the word line WL near 0 V.

Referring to FIGS. 3, 4 and 5, when there is no electron trapping state on the top of the blocking insulating film BIL, if the voltage applied to the word line WL is increased when the memory state is "1", the electron density of the channel pattern CHP increases and the channel current also increases. That is, a positive transconductance value is measured. Meanwhile, if the voltage applied to the word line WL is increased when the memory state is "0", the hole density of the channel pattern CHP decreases and the channel current also decreases. That is, a negative transconductance value is measured. This may be expressed as [Equation 2] below.

$$\begin{cases} \left.\dfrac{dI_{ds}}{dV_g}\right|_{V_g=0} > 0, & \text{memory state "1"} \\[2mm] \left.\dfrac{dI_{ds}}{dV_g}\right|_{V_g=0} < 0, & \text{memory state "0"} \end{cases} \qquad \text{[Equation 2]}$$

Referring to FIGS. 6, 7 and 8, when there are electron trap states on the upper portion of the blocking insulating film BIL, if the voltage applied to the word line WL is increased when the memory state is "1", the hole density of the channel pattern CHP decreases and the channel current also decreases. That is, a negative transconductance value is measured. Meanwhile, if the voltage applied to the word line WL is increased when the memory state is "0", the electron density of the channel pattern CHP increases and the channel current also increases. That is, a positive transconductance value is measured. This may be expressed as [Equation 3] below.

$$\begin{cases} \left.\dfrac{dI_{ds}}{dV_g}\right|_{V_g=0} < 0, & \text{memory state "1"} \\[2mm] \left.\dfrac{dI_{ds}}{dV_g}\right|_{V_g=0} > 0, & \text{memory state "0"} \end{cases} \qquad \text{[Equation 3]}$$

Figure 9:
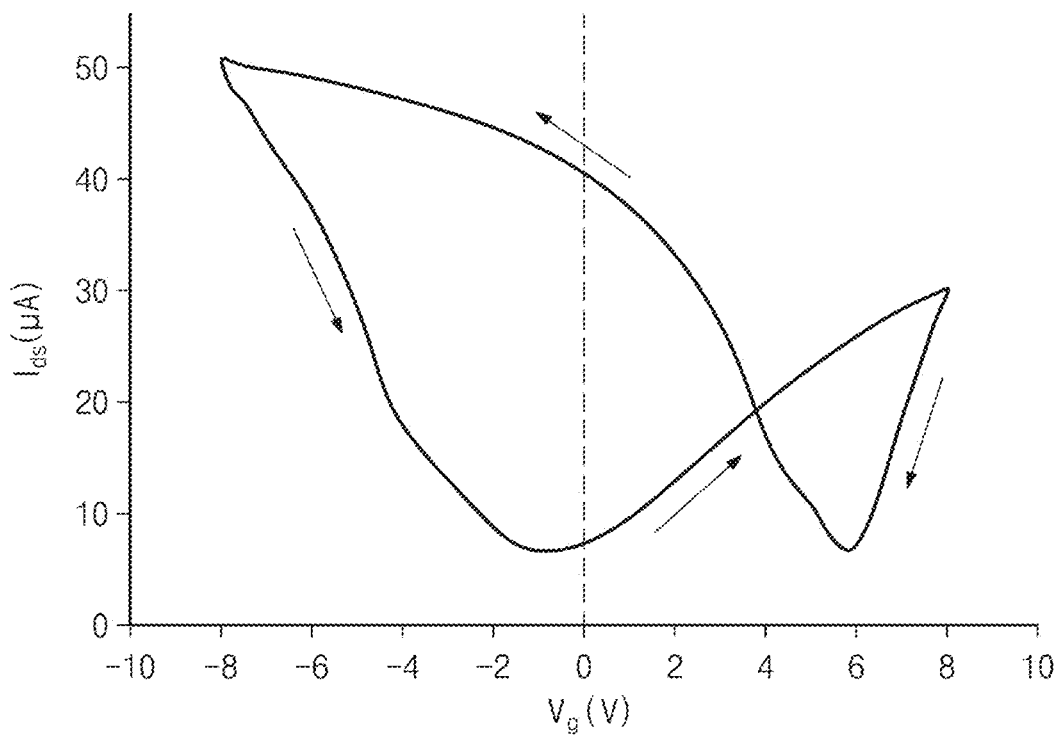
Figure 10:
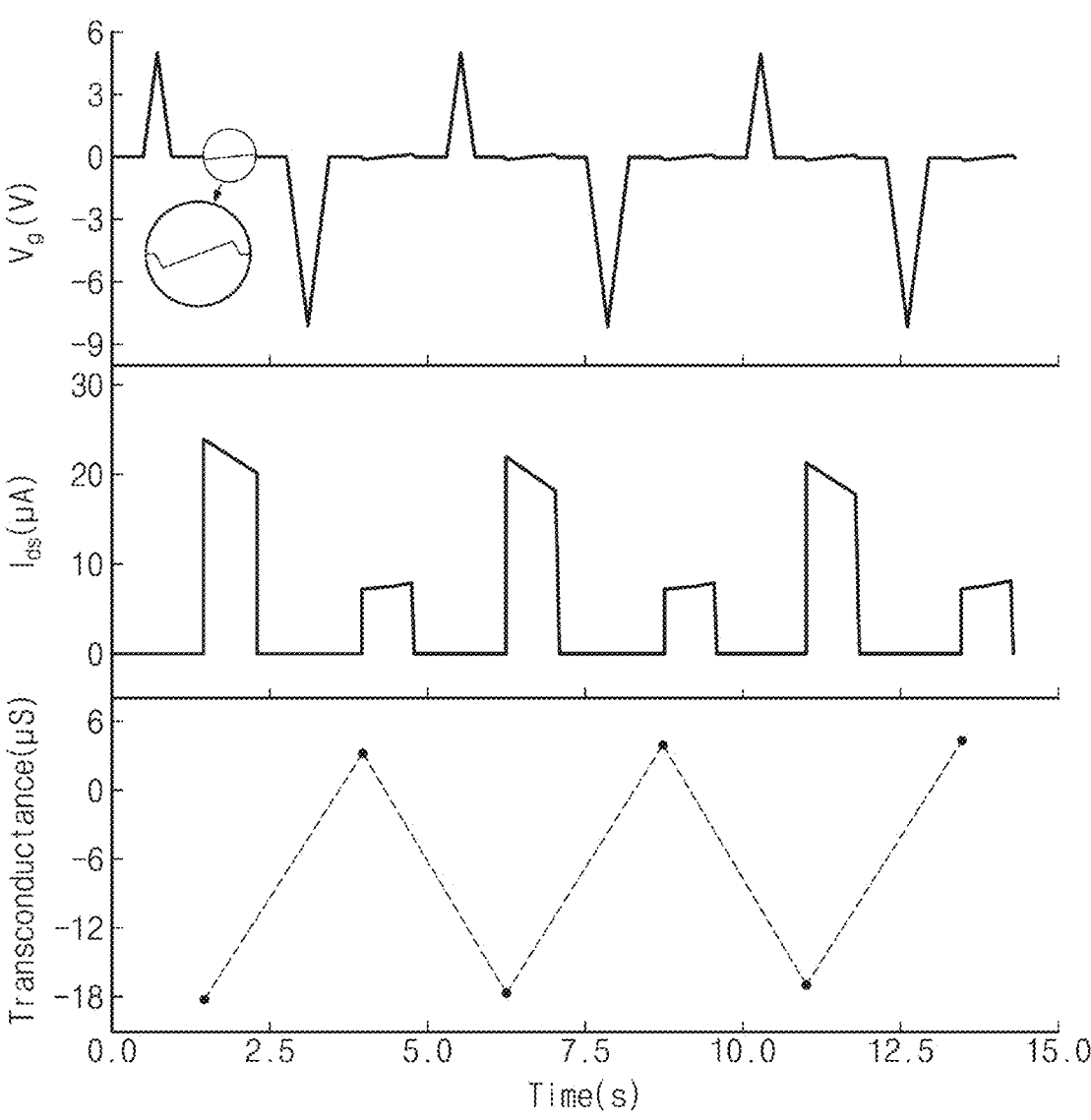

FIGS. 9 and 10 are graphs for explaining a method of operating a non-volatile memory device according to embodiments of the inventive concept.

More specifically, FIG. 9 shows a voltage transfer characteristic curve measured while changing the voltage applied to the word line WL in the arrow direction and FIG. 10 shows that the voltage applied to the word line WL, the channel current, and the transconductance value change with time.

Referring to FIG. 9, it may be seen that the illustrated voltage transfer characteristic curve is measured for a non-volatile memory device when there are electron trap states on the top of the blocking insulating film BIL (that is, anti-hysteretic behavior).

Referring to FIG. 10, first pulses are applied to the word line WL for a write-in operation. The first pulses may be, for example, triangular pulses, but the inventive concept is not limited thereto. Accordingly, the SP direction of the ferroelectric pattern FP may be switched. In addition, second pulses are applied to the word line WL for a read-out operation. The second pulses may be, for example, sawtooth pulses, but the inventive concept is not limited thereto. Second pulses for a read-out operation may be applied between the first pulses. The first pulses for the write-in operation and the channel current pulse measured during the read-out operation may be asymmetric. The transconductance value may be extracted from the channel current.

FIGS. 11A to 16A are plan views illustrating a method of manufacturing a non-volatile memory device according to embodiments of the inventive concept. FIGS. 11B to 16B are cross-sectional views taken along line A-A' of FIGS. 11A to 16A. In the following description, descriptions of contents overlapping those described with reference to FIGS. 1 to 10 may be omitted or simplified.

Figure 11A:
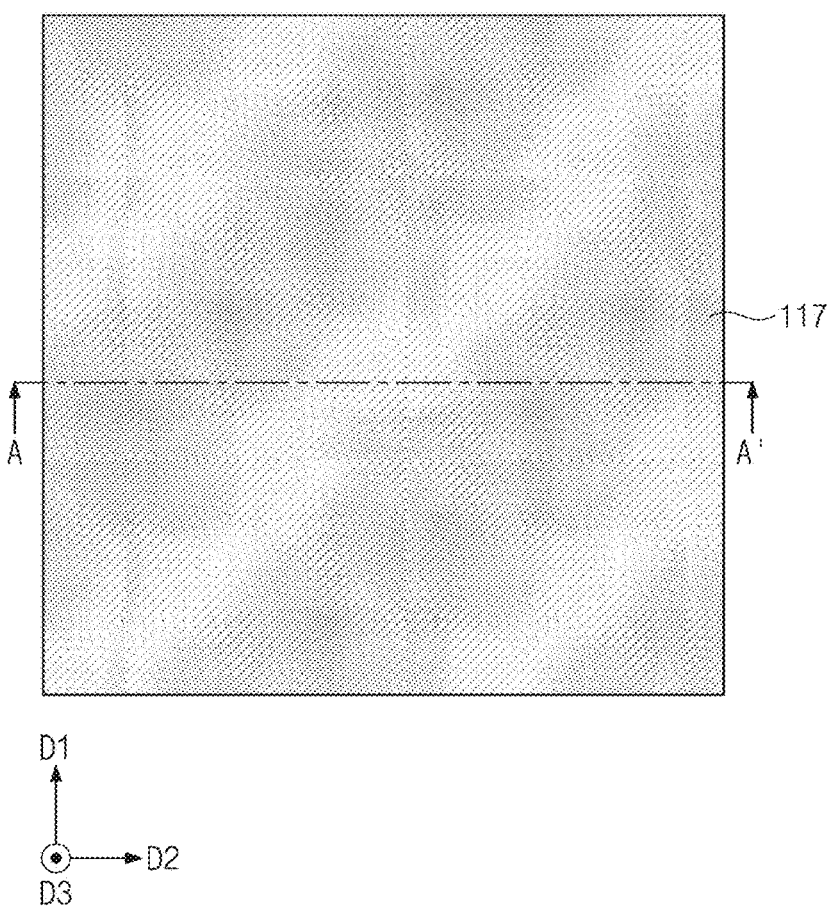
Figure 11B:
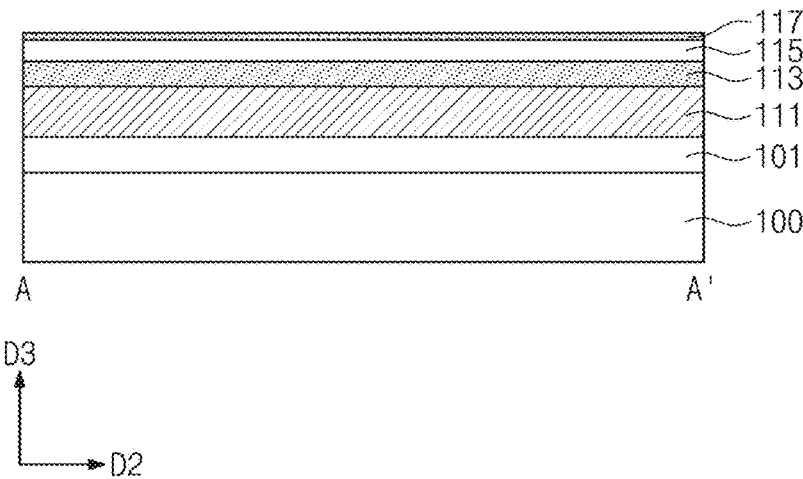

Referring to FIGS. 11A and 11B, a lower insulating film 101 may be provided on the substrate 100. The lower insulating film 101 may be formed by depositing an insulating material such as oxide ($SiO_2$, $Al_2O_3$, $HfO_2$, etc.), nitride (AlN, BN, etc.), or oxynitride ($SiO_xN_y$) on the substrate 100. Alternatively, the lower insulating film 101 may be a part of the SOI substrate. The substrate 100 may be a semiconductor substrate including at least one of silicon, germanium, and silicon-germanium, a silicon on insulator (SOI) substrate, a compound semiconductor substrate, a glass substrate, or a plastic substrate.

A first conductive film 111, a ferroelectric film 113, an upper insulating film 115, and a channel film 117 may be sequentially formed on the lower insulating film 101. The first conductive film 111, the ferroelectric film 113, the upper insulating film 115, and the channel film 117 may be formed by at least one of chemical vapor deposition, physical vapor deposition, and atomic layer deposition. The first conductive film 11 may be formed of at least one of doped semiconductors (e.g., doped silicon, etc.), metals (e.g., tungsten, copper, aluminum, platinum, titanium, tantalum, etc.), and conductive metal nitrides (e.g., titanium nitride, tantalum nitride, etc.). The ferroelectric film 113 may be formed of at least one of lead zirconate titanate (PZT), barium titanate ($BaTiO_3$), polyvinylidene fluoride (PVDF), ZnO, $HfO_x$, $Hf_{0.5}Zr_{0.5}O_2$(HZO), $(HfO_2)_x(Al_2O_3)_{1-x}$(HAO), and $Al_xS_{1-x}$ N. The upper insulating film 115 may be formed of oxide ($SiO_2$, $Al_2O_3$, $HfO_2$, etc.), nitride (AlN, BN, etc.), or oxynitride ($SiO_xN_y$). The channel film 117 may be formed of Dirac semimetal such as graphene.

For example, the channel film 117 may be formed thinner than the ferroelectric film 113. The upper insulating film 115 may be thicker than the channel film 117 and thinner than the ferroelectric film 113. The first conductive film 111 may be formed to be thicker than the ferroelectric film 113.

Figure 12A:
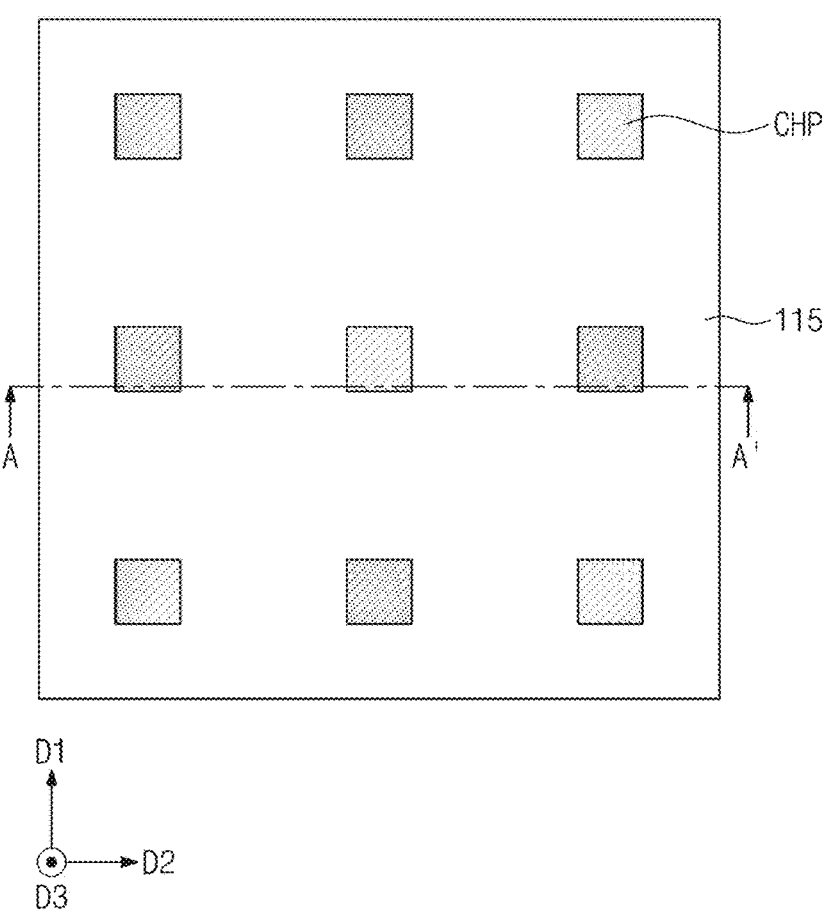
Figure 12B:
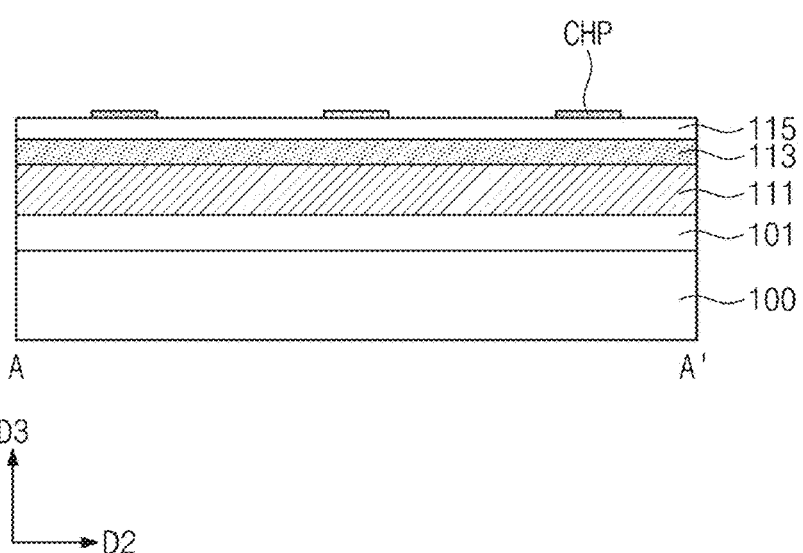

Referring to FIGS. 12A and 12B, channel patterns CHP spaced apart in the first direction D1 and the second direction D2 may be formed by patterning the channel film 117. The patterning of the channel film 117 may be performed by a lithography process. Alternatively, the channel patterns CHP may be directly formed in a selective region on the upper insulating film 115 by a solution process or a transfer process.

Figure 13A:
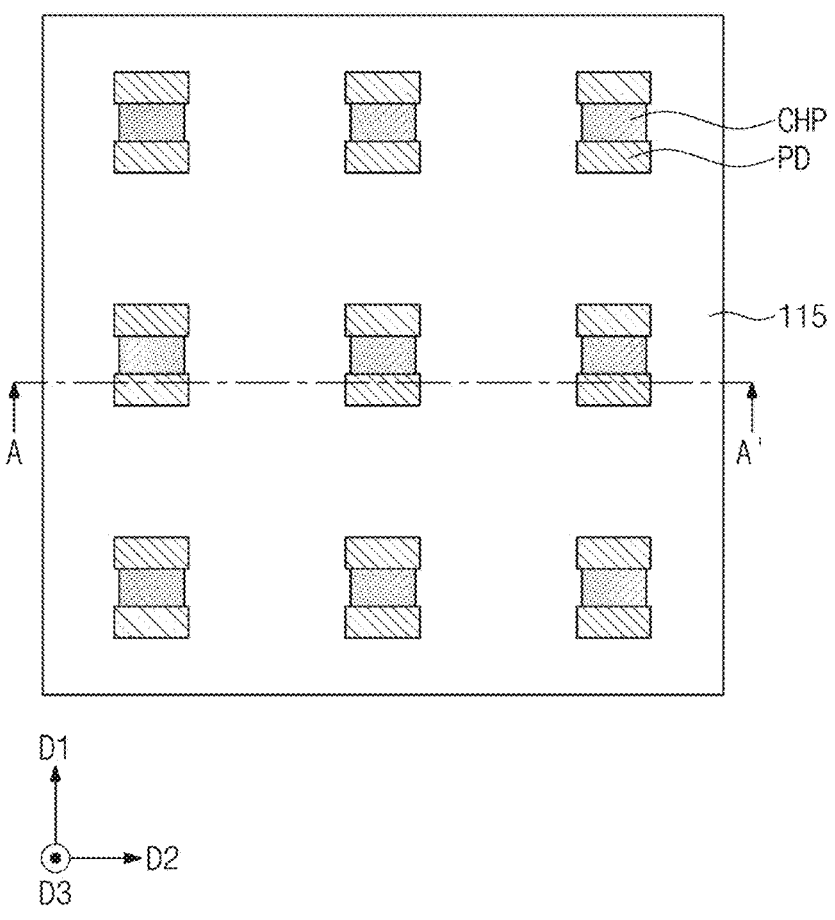
Figure 13B:
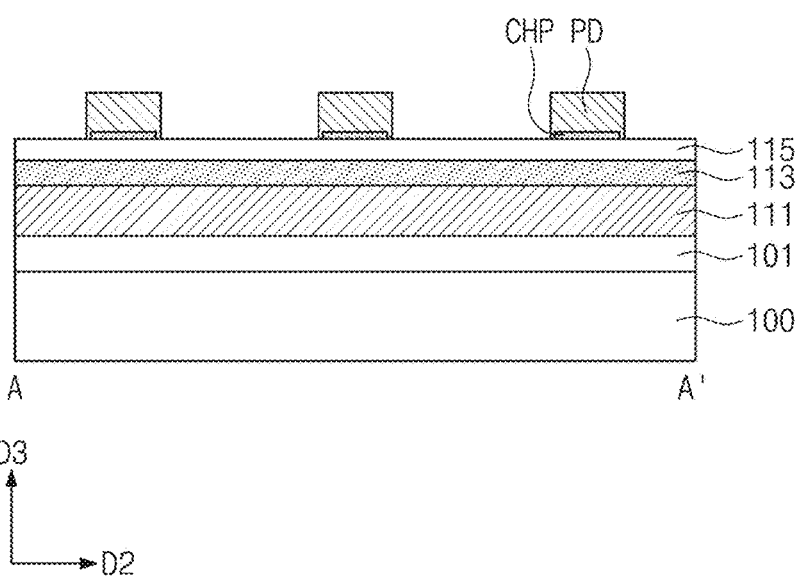

Referring to FIGS. 13A and 13B, conductive pads PD may be formed on the channel patterns CHP. A pair of conductive pads PD may be formed on each channel pattern CHP, and the pair of conductive pads PD may be spaced apart from each other in the first direction. The conductive pads PD may be formed of a metal material such as copper, aluminum, gold, or platinum.

Figure 14A:
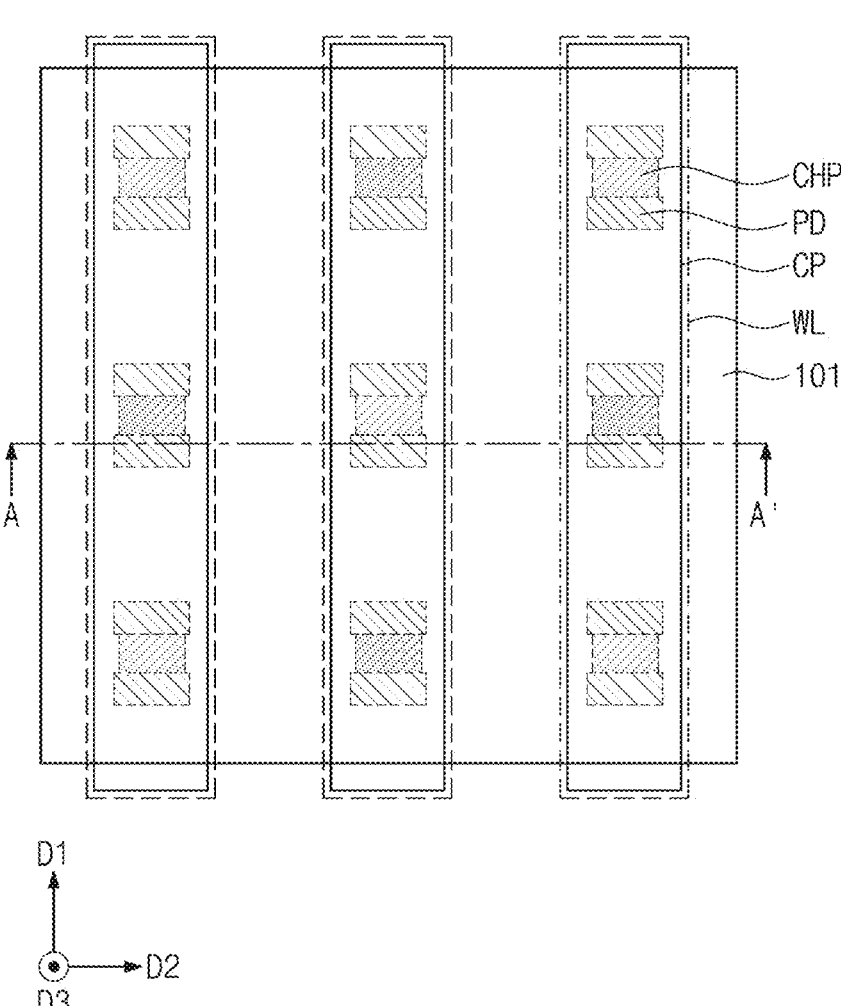
Figure 14B:
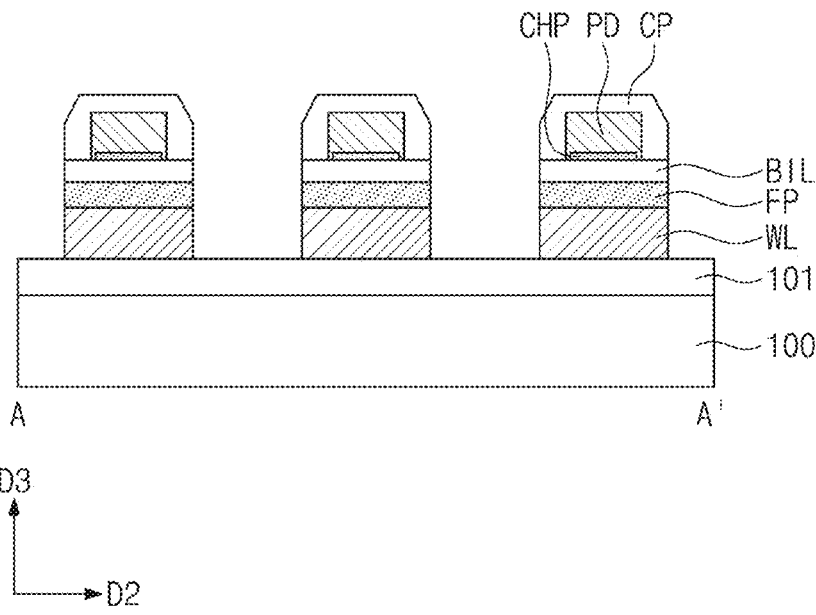

Referring to FIGS. 14A and 14B, capping patterns CP extending in the first direction and covering the plurality of channel patterns CHP may be formed. The capping patterns CP may be formed by forming a capping layer on the channel patterns CHP and then performing a lithography process. With the formation of the capping patterns CP, the upper insulating film 115, the ferroelectric film 113, and the first conductive film 111, which are layers below the capping patterns CP, are sequentially etched so that a blocking insulating film BIL, ferroelectric patterns FP, and word lines WL may be formed. That is, the capping patterns CP, the blocking insulating film BIL, the ferroelectric patterns FP, and the word lines WL are formed by the same patterning process, and as a result, may have sidewalls aligned with each other.

The etching of the upper insulating film 115, the ferroelectric film 113, and the first conductive film 111 may include a dry and/or wet etching process. As a result of the etching process, the upper surface of the lower insulating film 101 may be exposed, but otherwise, the upper surface of the substrate 100 may be exposed.

Figure 15A:
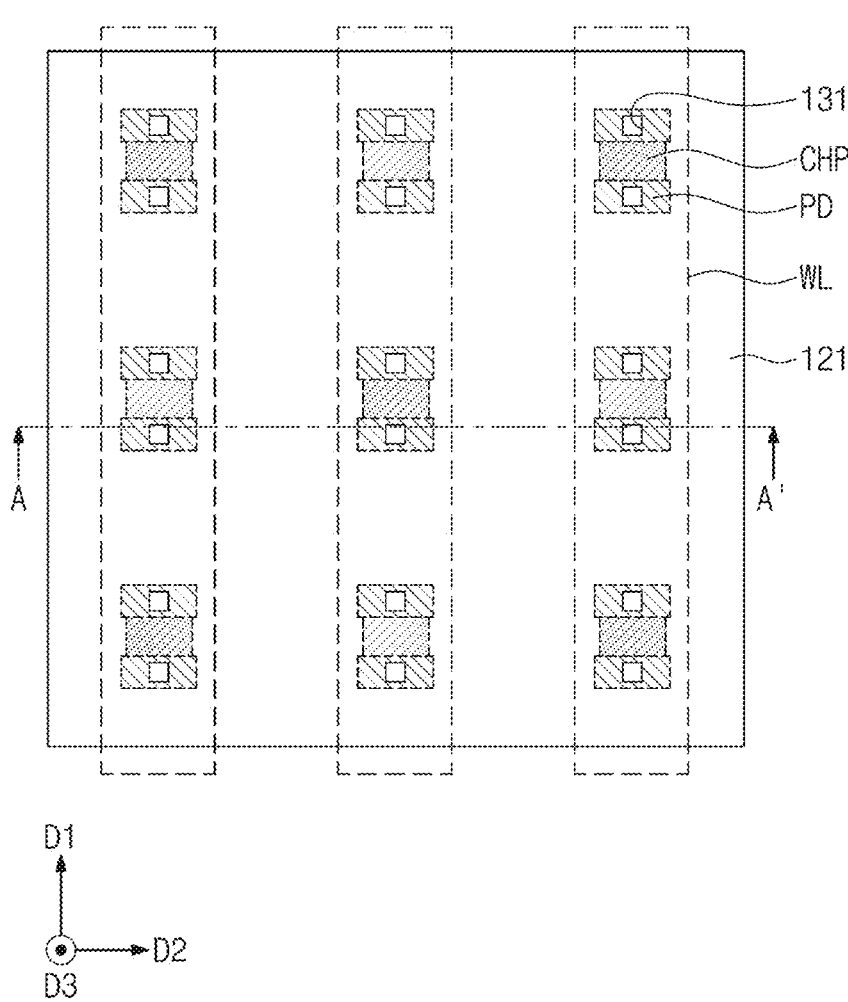
Figure 15B:
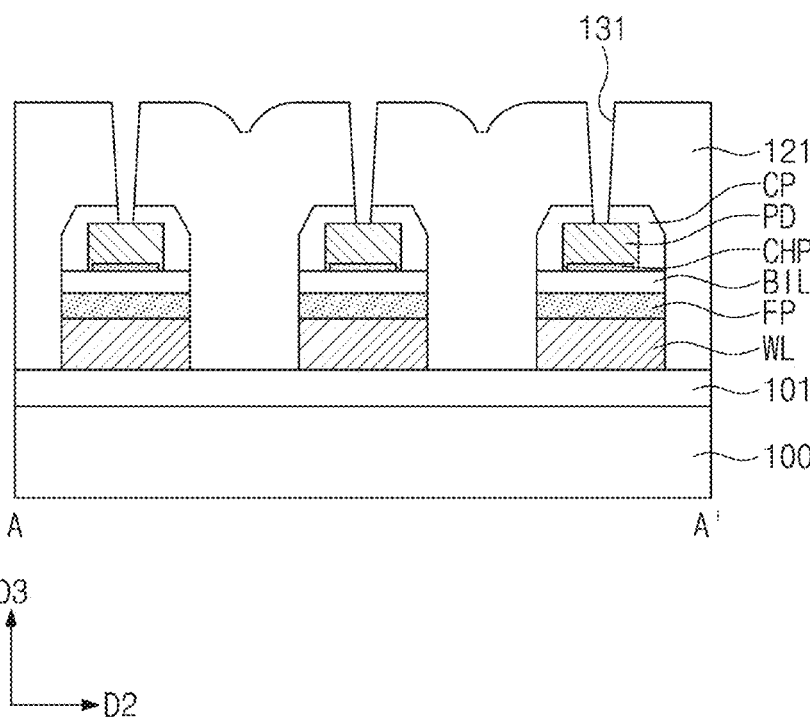

Referring to FIGS. 15A and 15B, a first interlayer insulating film 121 covering the capping patterns CP may be formed. The first interlayer insulating film 121 may be formed of silicon oxide or silicon oxynitride. An upper surface of the first interlayer insulating film 121 may have a shape corresponding to an upper surface profile of the capping patterns CP.

Via holes 131 exposing the conductive pads PD may be formed through the first interlayer insulating film 121. One via hole 131 may be formed in each conductive pad PD but alternatively, a plurality of via holes 131 may be formed in one conductive pad PD. The via holes 131 may be formed by forming a mask pattern such as a photoresist pattern on the first interlayer insulating film 121 and then performing a dry etching process using the mask pattern as an etching mask. Thereafter, the mask pattern may be removed.

Figure 16A:
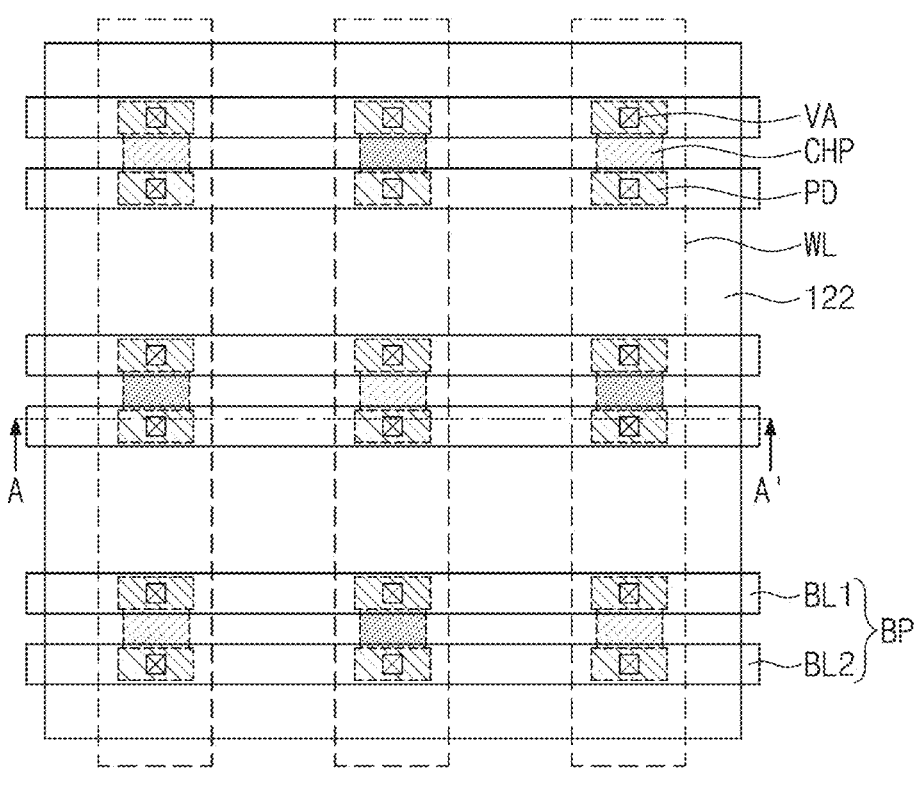
Figure 16A:
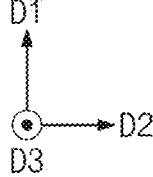
Figure 16B:
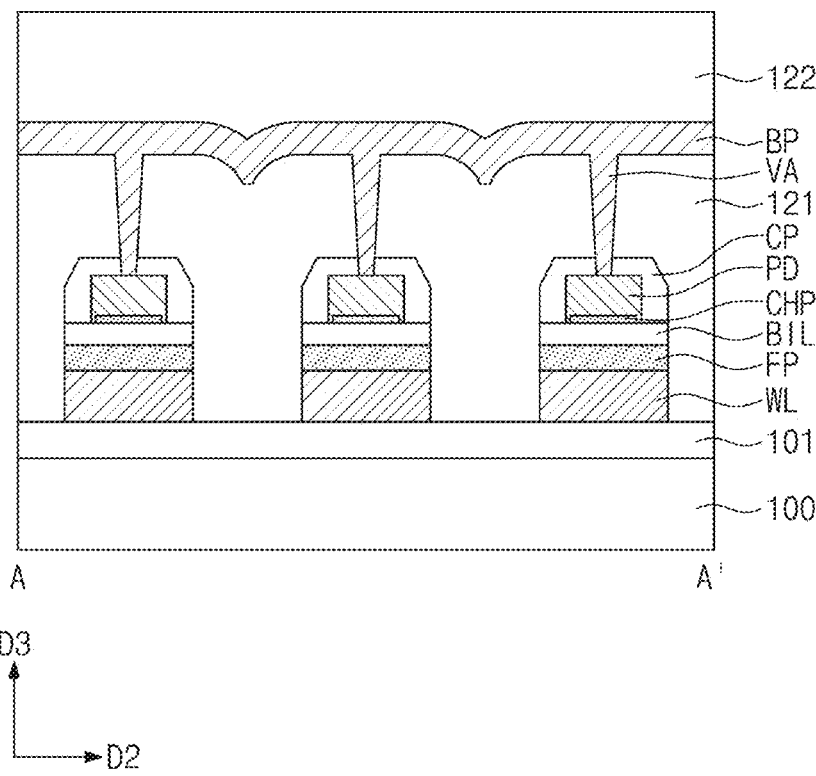

Referring to FIGS. 16A and 16B, vias VA filling the via holes 131 and bit line pairs BP may be formed. The vias VA and the bit line pairs BP may be formed together with a damascene process. Alternatively, the vias VA and the bit line pairs BP may be formed of different materials and may be formed with different processes. As an example, the vias VA and the bit line pairs BP may be formed by forming a conductive layer covering the first interlayer insulating film 121 and filling the via holes 131 and then performing a patterning process. For example, the vias VA and the bit line pairs BP may include a metal material such as aluminum, copper, tungsten, titanium, gold, or platinum. The bit line pairs BP are formed along the profile of the upper surface of the first interlayer insulating film 121 and may include protrusions protruding toward the substrate 100 as illustrated. Thereafter, a second interlayer insulating film 122 covering the bit line pairs BP may be formed. The second interlayer insulating film 122 may be formed of silicon oxide or silicon oxynitride. The formation of the second interlayer insulating film 122 may include a planarization process such as chemical mechanical polishing.

Figure 17:
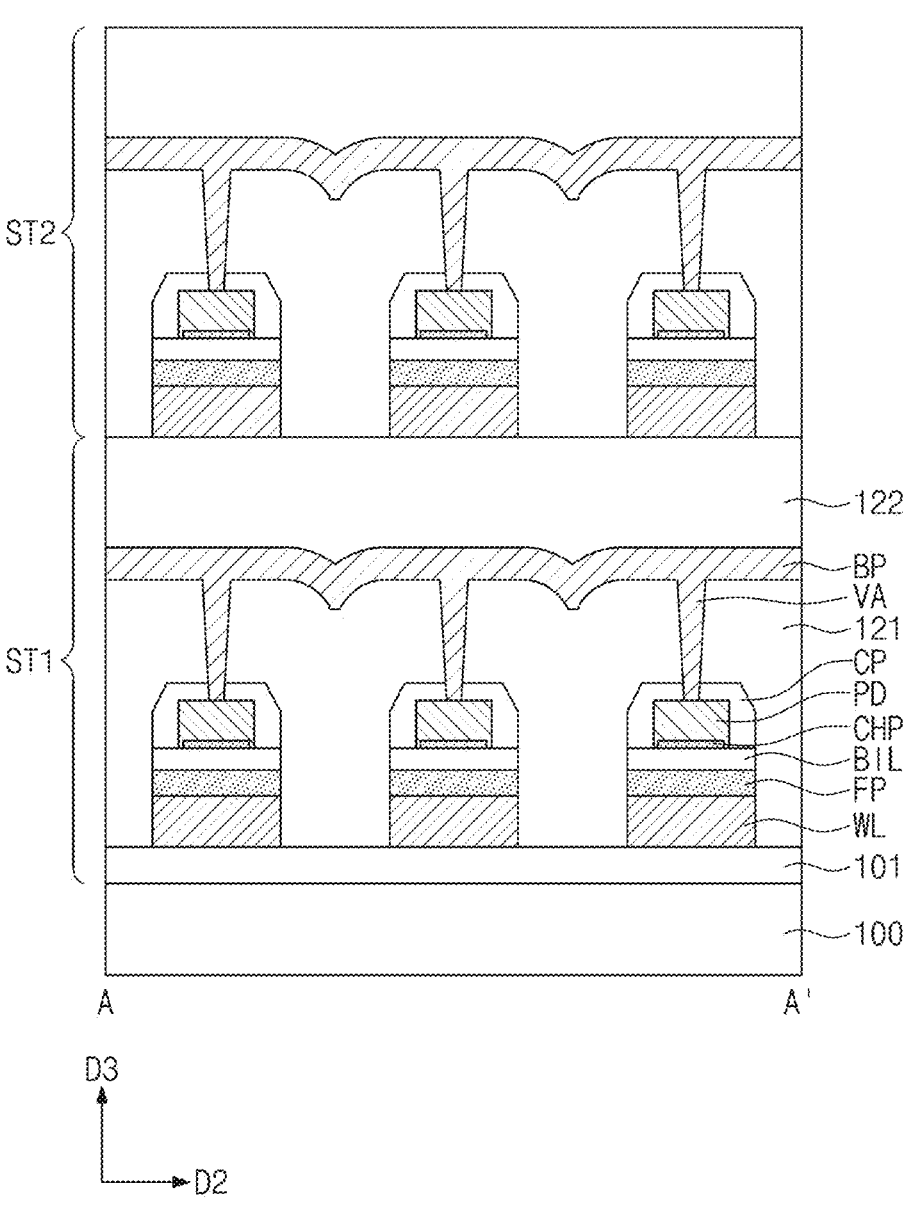
FIG. 17 is a cross-sectional view of a non-volatile memory device according to embodiments of the inventive concept.

FIG. 17 is a cross-sectional view of a non-volatile memory device according to embodiments of the inventive concept. In this embodiment, the non-volatile memory device may include a first memory stack ST1 and a second memory stack ST2. The first memory stack ST1 and the second memory stack ST2 may have the same memory structure as those described with reference to FIGS. 16A and 16B, respectively. Although a two-layer memory stack is shown for simplicity of description, memory stacks of three or more layers may be provided otherwise.

According to the inventive concept, it is possible to implement a non-volatile memory device capable of random access without a selection element or an additional write electrode. Since a separate selection element or an additional write electrode is not required, the structure of the memory cell is simplified and it is very advantageous to increase the density of the memory cell.

In addition, in relation to the non-volatile memory device according to the inventive concept, since the memory state is read through the sign change of the transconductance value of the ambipolar channel, the reading accuracy is higher than the method of reading the memory state only with the difference in channel current, and since the switching time of SP of ferroelectric material is as short as several tens of ps, driving speed is fast and SP switching is performed by voltage, power consumption required for write and read-out operations of memory cells is very small.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A non-volatile memory device, comprising:
a substrate;
a plurality of word lines on the substrate, each of the plurality of word lines extending lengthwise in a first direction;
a plurality of ferroelectric patterns respectively provided on the plurality of word lines;
a blocking insulating film covering the plurality of ferroelectric patterns;
a plurality of bit line pairs including a first bit line and a second bit line, the first bit line and the second bit line extending lengthwise in a second direction, crossing the word lines and crossing the plurality of ferroelectric patterns on the blocking insulating film, the second direction intersecting the first direction; and
a channel pattern provided between the first bit line and the second bit line of each of the plurality of bit line pairs on the blocking insulating film,
wherein the channel pattern has an ambipolar conduction characteristic.

2. The non-volatile memory device of claim 1, wherein the channel pattern comprises Dirac semimetal.

3. The non-volatile memory device of claim 2, wherein the channel pattern comprises graphene.

4. The non-volatile memory device of claim 1, wherein each of the plurality of ferroelectric patterns corresponds to each of the plurality of word lines and each of the plurality of ferroelectric patterns extends lengthwise in the first direction.

5. The non-volatile memory device of claim 4, wherein a width of each of the plurality of ferroelectric patterns in the second direction is equal to a width of each of the plurality of word lines in the second direction.

6. The non-volatile memory device of claim 1, wherein the plurality of ferroelectric patterns comprises at least one of lead zirconate titanate (PZT), barium titanate (BaTiO$_3$), polyvinylidene fluoride (PVDF), ZnO, HfO$_x$, Hf$_{0.5}$Zr$_{0.5}$O$_2$ (HZO), (HfO$_2$)$_x$(Al$_2$O$_3$)$_{1-x}$(HAO), and Al$_x$Sc$_{1-x}$N.

7. The non-volatile memory device of claim 1, wherein the blocking insulating film comprises aluminum oxide (Al$_2$O$_3$) or silicon oxide (SiO$_2$).

8. The non-volatile memory device of claim 1, wherein each of the first bit line and the second bit line of the plurality of bit line pairs is provided in plurality on the blocking insulating film and is provided alternately while going in the first direction.

9. The non-volatile memory device of claim 1, wherein in any one of the plurality of bit line pairs, an interval in the first direction between the first bit line and the second bit line is smaller than an interval in the first direction between the first bit line and a second neighboring bit line in a first other of the plurality of bit line pairs and is smaller than an interval in the first direction between the second bit line and a first neighboring bit line in a second other of the plurality of bit line pairs.

10. The non-volatile memory device of claim 1, wherein the channel pattern extends between the first bit line and the blocking insulating film and between the second bit line and the blocking insulating film.

11. The non-volatile memory device of claim 1, wherein the channel pattern is provided in plurality between one of the plurality of bit line pairs.

12. The non-volatile memory device of claim 1, wherein the channel pattern is provided in plurality, wherein the plurality of channel patterns are arranged in an array form on the blocking insulating film.

13. An operating method of a non-volatile memory device, wherein the non-volatile memory device comprises a substrate; a plurality of word lines on the substrate and extending lengthwise in a first direction on the substrate; a plurality of ferroelectric patterns respectively provided on the plurality of word lines; a blocking insulating film covering the plurality of ferroelectric patterns; a plurality of bit line pairs including a first bit line and a second bit line, the first bit line and the second bit line extending lengthwise in a second direction, crossing the plurality of word lines and crossing the plurality of ferroelectric patterns on the blocking insulating film, and the second direction intersecting the first direction; and a channel pattern on the blocking insulating film and between the first bit line and the second bit line of each of the bit line pairs on the blocking insulating film, wherein the method comprising:

applying a bias voltage between at least one of the plurality of bit line pairs so that a current flows in the channel pattern; and measuring a degree of change in the current while changing a first voltage applied to at least one of the plurality of word lines.

14. The method of claim 13, wherein when there is no electron trap state on an upper portion of the blocking insulating film, increasing the first voltage applied to the at least one of the plurality of word lines when a memory state is "1" increases the current, and when a memory state is "0", increasing the first voltage applied to the at least one of the plurality of word lines decreases the current.

15. The method of claim 13, wherein when there are electron trap states on an upper portion of the blocking insulating film, increasing the first voltage applied to the at least one of the plurality of word lines when a memory state is "1" decreases the current, and when a memory state is "0", increasing the first voltage applied to the at least one of the plurality of word lines increases the current.

16. The method of claim 13, further comprising extracting a transconductance value from the current.

17. The method of claim 13, wherein in measuring the degree of change of the current, the first applied to the at least one of the plurality of word lines changes around 0 V.

18. The method of claim 13, wherein the channel pattern comprises Dirac semimetal.

19. The method of claim 13, wherein the channel pattern is provided in plurality between the plurality of bit line pairs.

20. The method of claim 13, wherein the channel pattern is provided in plurality, wherein the plurality of channel patterns are arranged in an array form on the blocking insulating film.

* * * * *